(12) United States Patent
Uchida et al.

(10) Patent No.: US 9,276,127 B2
(45) Date of Patent: Mar. 1, 2016

(54) SEMICONDUCTOR DEVICE AND METHOD FOR PRODUCING SAME

(71) Applicant: Sharp Kabushiki Kaisha, Osaka-shi, Osaka (JP)

(72) Inventors: Seiichi Uchida, Osaka (JP); Tadayoshi Miyamoto, Osaka (JP); Yasuyuki Ogawa, Osaka (JP); Yutaka Takamaru, Osaka (JP); Kazuatsu Ito, Osaka (JP); Takuya Matsuo, Osaka (JP); Shigeyasu Mori, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/408,628

(22) PCT Filed: Jun. 11, 2013

(86) PCT No.: PCT/JP2013/066056
§ 371 (c)(1),
(2) Date: Dec. 17, 2014

(87) PCT Pub. No.: WO2013/191033
PCT Pub. Date: Dec. 27, 2013

(65) Prior Publication Data
US 2015/0243790 A1 Aug. 27, 2015

(30) Foreign Application Priority Data
Jun. 19, 2012 (JP) ................................. 2012-137699

(51) Int. Cl.
*H01L 29/10* (2006.01)
*H01L 29/786* (2006.01)
*H01L 27/12* (2006.01)
(Continued)

(52) U.S. Cl.
CPC ...... *H01L 29/7869* (2013.01); *H01L 21/02565* (2013.01); *H01L 21/425* (2013.01); *H01L 21/441* (2013.01); *H01L 27/1225* (2013.01); *H01L 29/24* (2013.01); *H01L 29/45* (2013.01); *H01L 29/66969* (2013.01); *G02F 1/1368* (2013.01)

(58) Field of Classification Search
CPC ...................... H01L 29/7869; H01L 29/78693
USPC ............. 438/158, 159; 257/43, E29.296, 231
See application file for complete search history.

(56) References Cited

U.S. PATENT DOCUMENTS

2010/0044707 A1\* 2/2010 Kong et al. ...................... 257/57
2011/0204370 A1\* 8/2011 Yoon et al. ....................... 257/59
(Continued)

FOREIGN PATENT DOCUMENTS

JP 2011-091279 A 5/2011
WO 2013/115051 A1 8/2013

*Primary Examiner* — Kimberly Rizkallah
*Assistant Examiner* — Maria Ligai
(74) *Attorney, Agent, or Firm* — Keating & Bennett, LLP (57) ABSTRACT

This TFT substrate (100A) includes: a gate connecting layer (3a) formed on a substrate (1) out of a same conductive film as a gate electrode (3) or a transparent connecting layer (2a) formed on the substrate (1) out of a same conductive film as a first transparent electrode (2); an oxide layer (5z) which is formed on an insulating layer (4) and which includes at least one conductor region (5a); and a source connecting layer (6a) formed on the oxide layer (5z) out of a same conductor film as a source electrode (6s). The source connecting layer (6a) is electrically connected to either the gate connecting layer (3a) or the transparent connecting layer (2a) via the at least one conductor region (5a).

14 Claims, 9 Drawing Sheets

(51) Int. Cl.
*H01L 21/02* (2006.01)
*H01L 21/425* (2006.01)
*H01L 21/441* (2006.01)
*H01L 29/24* (2006.01)
*H01L 29/45* (2006.01)
*H01L 29/66* (2006.01)
*G02F 1/1368* (2006.01)

(56) References Cited

U.S. PATENT DOCUMENTS

2011/0309363 A1* 12/2011 Misaki ............................ 257/59
2013/0015449 A1* 1/2013 Lee et al. ........................ 257/59

* cited by examiner

SEMICONDUCTOR DEVICE AND METHOD FOR PRODUCING SAME

TECHNICAL FIELD

The present invention relates to a semiconductor device which is formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be hereinafter referred to as "TFTs"), each of which is provided for an associated one of pixels. An active-matrix substrate including TFTs as switching elements is called a "TFT substrate".

As for TFTs, a TFT which uses an amorphous silicon film as its active layer (and will be hereinafter referred to as an "amorphous silicon TFT") and a TFT which uses a polysilicon film as its active layer (and will be hereinafter referred to as a "polysilicon TFT") have been used extensively.

Recently, people have proposed that an oxide semiconductor be used as a material for the active layer of a TFT instead of amorphous silicon or polysilicon. Such a TFT will be hereinafter referred to as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor layer locally lowered.

Recently, as the definition of liquid crystal display devices and other devices has become higher and higher, a decrease in pixel aperture ratio has become an increasingly serious problem. In this description, the "pixel aperture ratio" refers herein to the ratio of the combined area of pixels (e.g., the combined area of regions which transmit light that contributes to a display operation in a transmissive liquid crystal display device) to the overall display area. In the following description, the "pixel aperture ratio" will be hereinafter simply referred to as an "aperture ratio".

Among other things, a medium to small sized transmissive liquid crystal display device to be used in a mobile electronic device has so small a display area that each of its pixels naturally has a very small area and the aperture ratio will decrease particularly significantly when the definition is increased. On top of that, if the aperture ratio of a liquid crystal display device to be used in a mobile electronic device decreases, the luminance of the backlight needs to be increased to achieve an intended brightness, thus causing an increase in power dissipation, too, which is also a problem.

To achieve a high aperture ratio, the combined area occupied by a TFT, a storage capacitor, and other elements of a non-transparent material in each pixel may be decreased. However, naturally, the TFT and the storage capacitor should have their minimum required size to perform their function. When oxide semiconductor TFTs are used as TFTs, the TFTs can have a smaller size than when amorphous silicon TFTs are used, which is advantageous. It should be noted that in order to maintain a voltage that has been applied to the liquid crystal layer of a pixel (which is called a "liquid crystal capacitor" electrically), the "storage capacitor" is provided electrically in parallel with the liquid crystal capacitor. In general, at least a portion of the storage capacitor is arranged so as to overlap with the pixel.

CITATION LIST

Patent Literature

Patent Document No. 1: Japanese Laid-Open Patent Publication No. 2011-91279

SUMMARY OF INVENTION

Technical Problem

However, demands for increased aperture ratios are too huge to satisfy just by using oxide semiconductor TFTs. Meanwhile, as the prices of display devices have become lower and lower year after year, development of a technology for manufacturing high-definition, high-aperture-ratio display devices at a lower cost is awaited.

Thus, a primary object of embodiments of the present invention is to provide a TFT substrate which can be fabricated by a simpler process and which can contribute to realizing a display device with higher definition and a higher aperture ratio than conventional ones and also provide a method for fabricating such a TFT substrate.

Solution to Problem

A semiconductor device according to an embodiment of the present invention includes a substrate, and a thin-film transistor and a first transparent electrode which are formed on the substrate. The thin-film transistor includes: a gate electrode formed on the substrate; a first insulating layer formed over the gate electrode; an oxide semiconductor layer formed on the first insulating layer; and source and drain electrodes electrically connected to the oxide semiconductor layer. The semiconductor device further includes: a gate connecting layer formed on the substrate out of a same conductive film as the gate electrode, or a transparent connecting layer formed on the substrate out of a same conductive film as the first transparent electrode; an oxide layer which is formed on the first insulating layer and which includes at least one conductor region; and a source connecting layer formed on the oxide layer out of a same conductive film as the source electrode. The source connecting layer is electrically connected to either the gate connecting layer or the transparent connecting layer via the at least one conductor region.

In one embodiment, the conductor region contains an impurity at a higher concentration than the oxide semiconductor layers.

In one embodiment, the semiconductor device further includes a second transparent electrode arranged so as to overlap partially with the first transparent electrode with the first insulating layer interposed between them. The oxide semiconductor layer, the oxide layer and the second transparent electrode are formed out of a same oxide film.

In one embodiment, the oxide film includes In, Ga and Zn.

In one embodiment, the drain electrode is formed on the second transparent electrode, and the second transparent electrode is in direct contact with the drain electrode.

In one embodiment, the semiconductor device further includes a second insulating layer formed between the gate electrode and the substrate, and the second insulating layer is formed on the first transparent electrode.

In one embodiment, the semiconductor device further includes a second insulating layer formed on the gate electrode, and the first transparent electrode is formed on the second insulating layer.

A method for fabricating a semiconductor device according to an embodiment of the present invention includes the steps of: (a) providing a substrate; (b) forming, on the substrate, a gate electrode and a gate connecting layer out of a same first conductive film and a first transparent electrode and a transparent connecting layer out of a same transparent conductive film; (c) forming a first insulating layer over the gate electrode and the first transparent electrode; (d) forming an oxide semiconductor film over the first insulating layer; (e) forming a second conductive film on the oxide semiconductor film, then forming first and second oxide semiconductor films separated from each other out of the oxide semiconductor film and forming a source electrode, a drain electrode and a source connecting layer out of the second conductive film; and (f) forming an oxide layer including a conductor region by performing a resistance lowering process to lower a resistance of a portion of the second oxide semiconductor film, an oxide semiconductor layer being formed in a rest of the first oxide semiconductor film, of which a resistance has not been lowered through the resistance lowering process, wherein the source connecting layer is electrically connected to either the gate connecting layer or the transparent connecting layer via the conductor region.

In one embodiment, the step (f) includes the step (f1) of forming a second transparent electrode by performing the resistance lowering process on a portion of the first oxide semiconductor film, the second transparent electrode overlapping at least partially with the first transparent electrode with the first insulating layer interposed between them.

In one embodiment, the step (f) includes the step of implanting an impurity into the first and second oxide semiconductor films.

In one embodiment, the step (b) includes the steps of: forming the first transparent electrode on the substrate and a second insulating layer on the first transparent electrode, respectively; and forming the gate electrode on the second insulating layer.

In one embodiment, the step (b) includes the steps of: forming the gate electrode on the substrate and a second insulating layer on the gate electrode, respectively; and forming the first transparent electrode on the second insulating layer.

Advantageous Effects of Invention

Embodiments of the present invention provide a TFT substrate which can be fabricated by a simpler process and which can contribute to realizing a display device with higher definition and a higher aperture ratio than conventional ones and also provide a method for fabricating such a TFT substrate.

BRIEF DESCRIPTION OF DRAWINGS

FIG. 1 (a) is a schematic plan view of a TFT substrate 100A according to an embodiment of the present invention. (b) is a schematic plan view of the TFT substrate 100A as viewed on the plane A-A' shown in (a).

FIG. 2 (a) is a schematic plan view illustrating a structure for connecting a gate connecting layer 3a or a transparent connecting layer 2a to a source connecting layer 6a. (b) is a schematic cross-sectional view thereof as viewed on the plane B-B' shown in (a).

FIG. 4 (a) is a schematic plan view illustrating another structure for connecting a gate connecting layer 3a or a transparent connecting layer 2a to a source connecting layer 6a. (b) is a schematic cross-sectional view thereof as viewed on the plane B-B' shown in (a).

DESCRIPTION OF EMBODIMENTS

A semiconductor device as an embodiment of the present invention will now be described with reference to the accompanying drawings. The semiconductor device of this embodiment includes a thin-film transistor with an active layer made of an oxide semiconductor (which will be hereinafter referred to as an "oxide semiconductor TFT"). It should be noted that the semiconductor device of this embodiment just needs to include an oxide semiconductor TFT and is broadly applicable to an active-matrix substrate and various kinds of display devices and electronic devices.

In the following description, a semiconductor device as an embodiment of the present invention will be described as being applied to an oxide semiconductor TFT for use in a liquid crystal display device. It should be noted that the TFT substrate to be described below shares some common features with the TFT substrate disclosed in PCT International Application No. PCT/2013/051417, the entire disclosure of which is hereby incorporated by reference.

Figure 1:
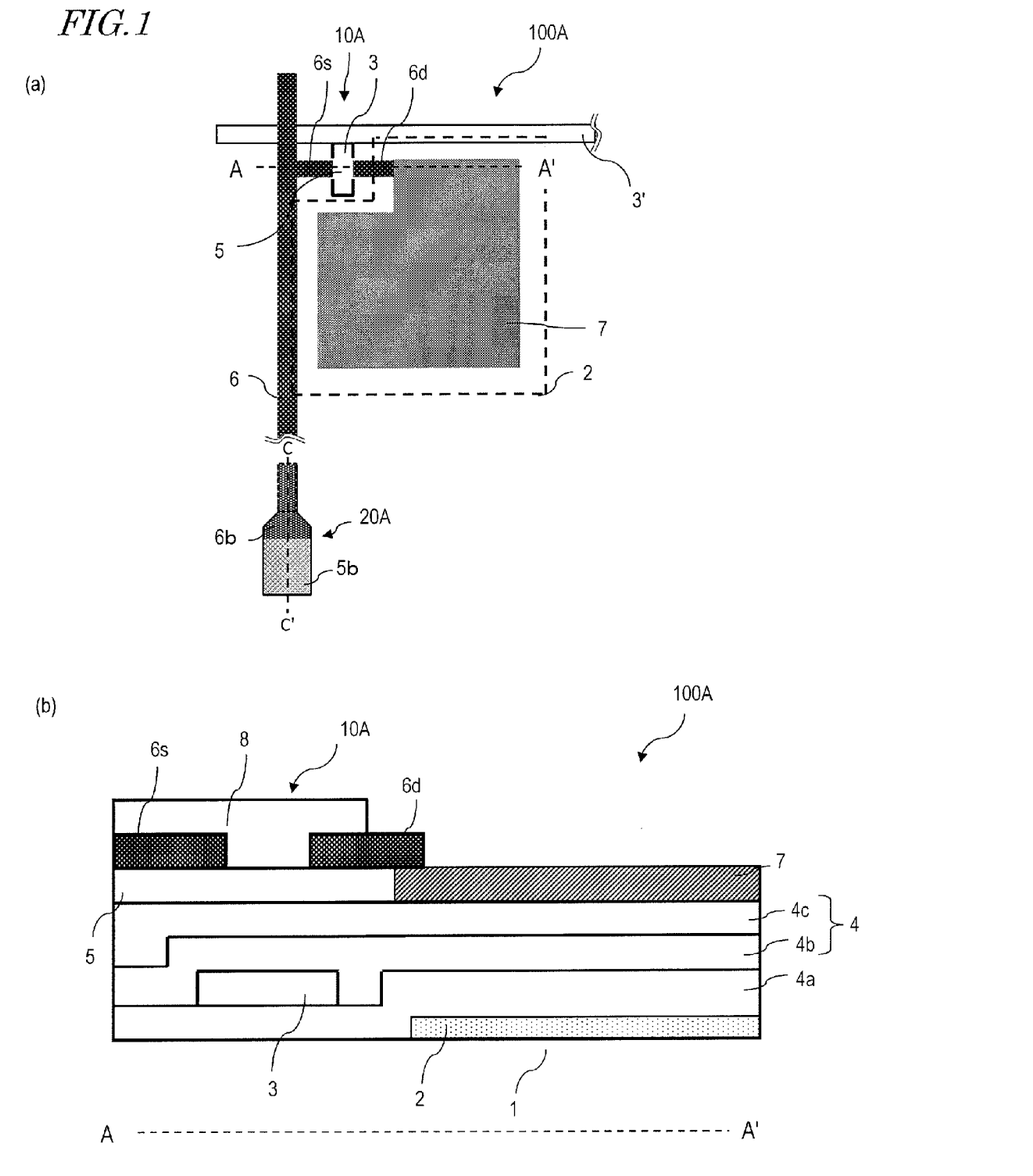
Figure 2:
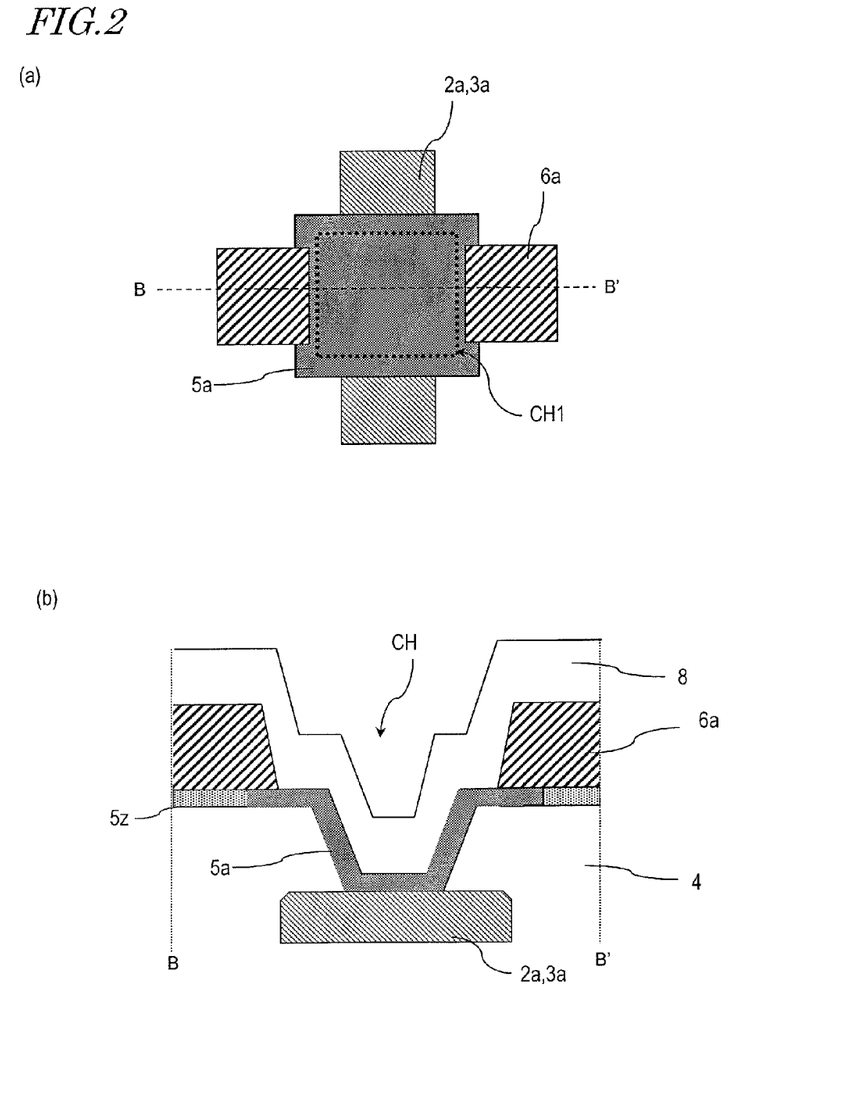
Figure 3:
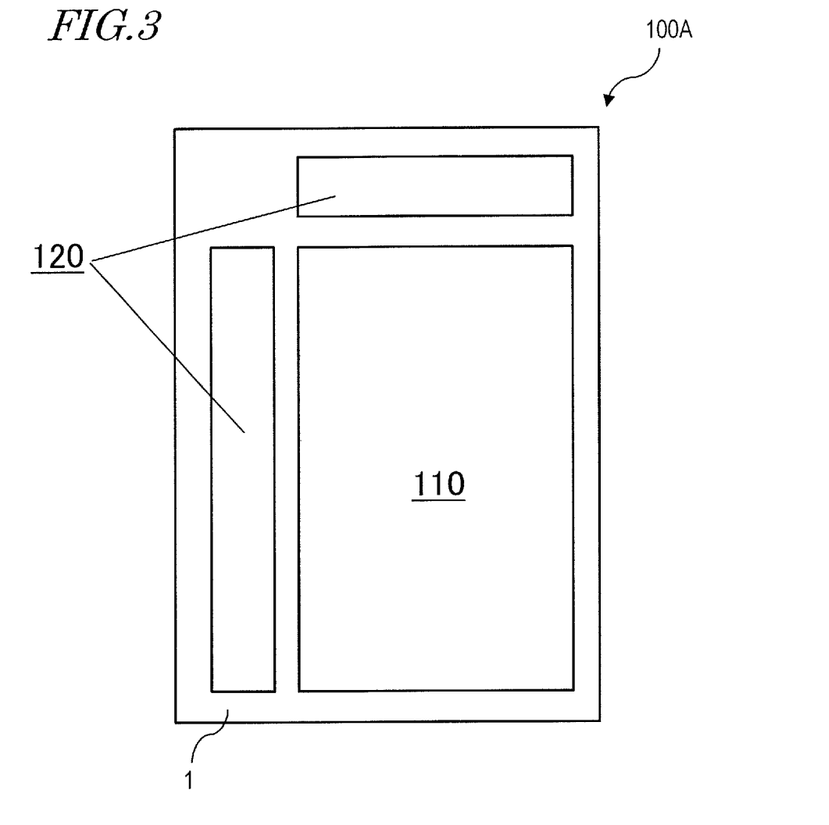
FIG. 3 A schematic plan view of the TFT substrate 100A.

FIGS. 1(a) and 3 are schematic plan views of a semiconductor device (TFT substrate) 100A according to this embodiment. FIG. 1(b) is a schematic cross-sectional view of the TFT substrate 100A as viewed on the plane shown in FIG. 1(a). FIG. 2(a) is a schematic plan view illustrating how a transparent connecting layer 2a or a gate connecting layer 3a is electrically connected to a source connecting layer 6a. And FIG. 2(b) is a schematic cross-sectional view thereof as viewed on the plane B-B' shown in FIG. 2(a).

As shown in FIGS. 1(a) and 1(b), the TFT substrate 100A includes a substrate 1 and a thin-film transistor (TFT) 10A and a transparent electrode 2 which are formed on the substrate 1. The TFT 10A includes: a gate electrode 3 which has been formed on the substrate 1; an insulating layer (gate insulating layer) 4 which has been formed over the gate electrode 3; an oxide semiconductor layer 5 which has been formed on the insulating layer 4; and source and drain electrodes 6s, 6d which are electrically connected to the oxide semiconductor layer 5.

As shown in FIGS. 2(a) and 2(b), the TFT substrate 100A further includes: a gate connecting layer 3a which has been formed on the substrate 1 out of the same conductive film as the gate electrode 3 or a transparent connecting layer 2a which has also been formed on the substrate 1 out of the same conductive film as the transparent electrode 2; an oxide layer 5z which has been formed on the insulating layer 4 and which includes at least one conductor region 5a; and a source connecting layer 6a which has been formed on the oxide layer 5z out of the same conductive film as the source electrode 6s. The source connecting layer 6a is electrically connected to either the gate connecting layer 3a or the transparent connecting layer 2a via that at least one conductor region 5a.

As will be described in detail later, this TFT substrate 100A can be fabricated by a simple manufacturing process, and the source connecting layer 6a and either the gate connecting layer 3a or the transparent connecting layer 2a are electrically connected together via the conductor region 5a. As a result, the TFT substrate 10A can be formed in a display area 110 contributing to a display operation on the substrate 1, and the source connecting layer 6a and either the gate connecting layer 3a or the transparent connecting layer 2a can be formed in a driver circuit area 120 surrounding the display area 110 as shown in FIG. 3. Consequently, a pixel circuit contributing to a display operation and a driver circuit driving the pixel circuit can be integrated together on the same substrate 1, and a high-definition display device is realized.

As shown in FIGS. 2(a) and 2(b), an insulating layer 4 has been formed over either the gate connecting layer 3a or transparent connecting layer 2a and a conductor region 5a is electrically connected to either the gate connecting layer 3a or transparent connecting layer 2a inside a contact hole CH formed in the insulating layer 4. Furthermore, a source connecting layer 6a has been formed on, and electrically connected to, the conductor region 5a. The source connecting layer 6a is not present inside the contact hole CH. A protective layer 8 has been formed over the source connecting layer 6a. In some cases, the insulating layer arranged on either the gate connecting layer 3a or transparent connecting layer 2a may include an additional insulating layer besides the insulating layer 4. Also, as will be described in detail later, the conductor region 5a may contain an impurity (such as B (boron)) at a higher concentration than the oxide semiconductor layer 5.

Figure 4:
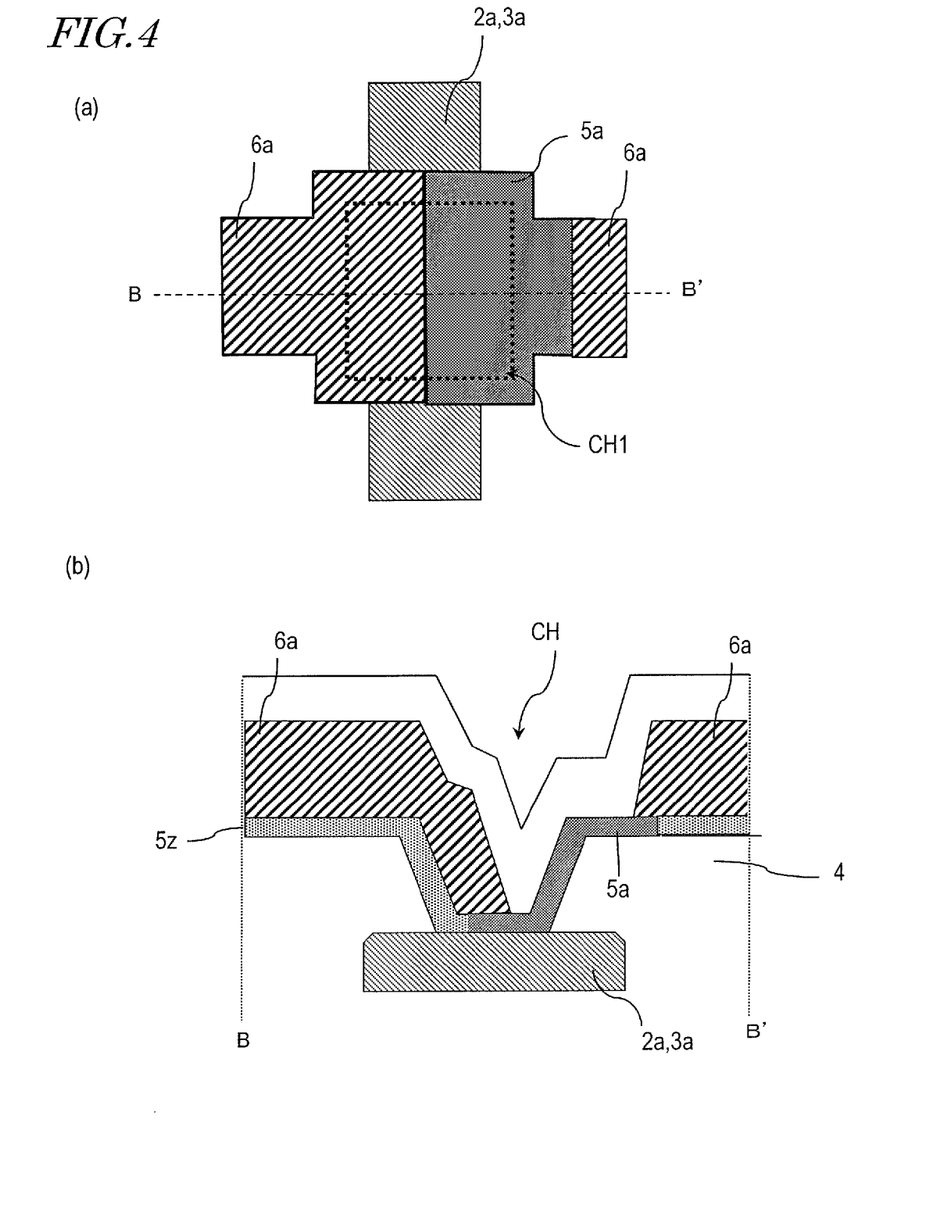

Alternatively, instead of such a structure for connecting the gate connecting layer 3a or transparent connecting layer 2a to the source connecting layer 6a shown in FIGS. 2(a) and 2(b), a connecting structure as shown in FIG. 4 may be adopted.

FIG. 4(a) is a schematic plan view illustrating how either the transparent connecting layer 2a or gate connecting layer 3a may be electrically connected to the source connecting layer 6a, and FIG. 4(b) is a cross-sectional view as viewed on the plane B-B' shown in FIG. 4(a).

In this structure for connecting either the transparent connecting layer 2a or gate connecting layer 3a to the source connecting layer 6a shown in FIG. 4, the conductor region 5a is electrically connected to a portion of the source connecting layer 6a inside the contact hole CH, which is a difference from the structure shown in FIG. 3.

More specifically, a portion of the source connecting layer 6a is present inside the contact hole CH and is electrically connected to the conductor region 5a that is arranged inside the contact hole CH.

As shown in FIGS. 1(a) and 1(b), the TFT substrate 100A further includes a transparent electrode 7 which is arranged so as to overlap with a portion of the transparent electrode 2 with the insulating layer 4 interposed between them. The oxide semiconductor layer 5, oxide layer 5z and transparent electrode 7 are formed out of the same oxide film (such as an In—Ga—Zn—O based semiconductor film including In (indium), Ga (gallium) and Zn (zinc)).

In this TFT substrate 100A, at least a part of the transparent electrode 2 overlaps with the transparent electrode 7 with the insulating layer 4 interposed between them, thus forming a storage capacitor there. However, the storage capacitor that this TFT substrate 100A has is transparent (i.e., can transmit visible light), and does not decrease the aperture ratio. Consequently, this TFT substrate 100A can have a higher aperture ratio than a conventional TFT substrate with a storage capacitor including a non-transparent electrode which has been formed out of a metal film (i.e., a gate metal layer or source metal layer). On top of that, since the aperture ratio is not decreased by the storage capacitor, the capacitance value of the storage capacitor (i.e., the area of the storage capacitor) can be increased as needed, which is also advantageous.

Furthermore, a drain electrode 6d has been formed on the transparent electrode 7 and the transparent electrode 7 is suitably in direct contact with the drain electrode 6d. If such a structure is adopted, the transparent electrode 7 can be formed to almost reach an end portion of the drain electrode 6d, and therefore, this TFT substrate 100A can have a higher aperture ratio than the TFT substrate disclosed in Patent Document No. 1.

A protective layer 8 has been formed over the source and drain electrodes 6s and 6d.

In this TFT substrate 100A, the transparent electrode 2 has been formed on the substrate 1 and covered with the insulating layer 4a, on which the gate electrode 3 is arranged as shown in FIG. 1(b).

Figure 5:
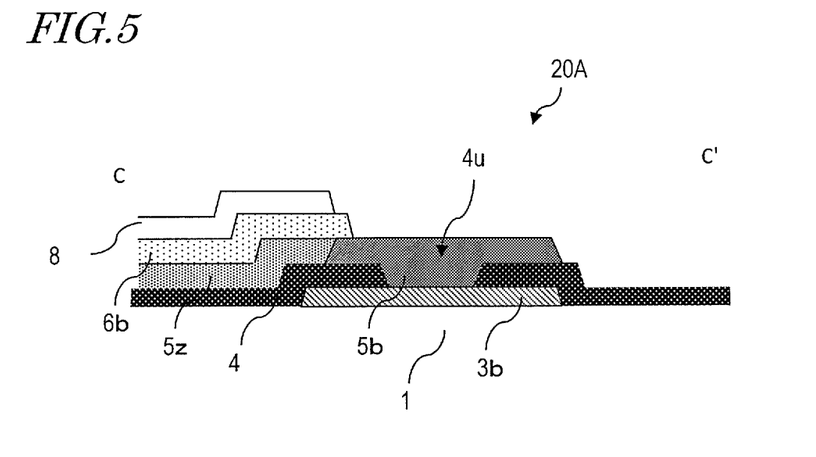
FIG. 5 A schematic cross-sectional view of a terminal portion 20A as viewed on the plane C-C' shown in FIG. 1(a).

Next, a terminal portion 20A that the TFT substrate 100A has will be described with reference to FIG. 5, which is a schematic cross-sectional view of the terminal portion 20A as viewed on the plane C-C' shown in FIG. 1(a).

This TFT substrate 100A includes a plurality of terminal portions 20A. By electrically connecting these terminal portions 20A to an external circuit's terminals (such as flexible terminals), for example, the external circuit and the TFTs 10A can be electrically connected together.

The terminal portion 20A includes a gate connecting layer 3b, an oxide layer 5z which has been formed over the gate connecting layer 3b and which includes at least one conductor region 5b, and a source connecting layer 6b which has been formed on the oxide layer 5z. The source connecting layer 6b is electrically connected to the gate connecting layer 3b via the conductor region 5b.

As the conductor region 5b is provided for the terminal portion 20A with such a configuration, the flexible terminal and the source connecting layer 6b can make electrical contact with each other in so increased an area that the contact resistance between them can be reduced. On top of that, since the oxide layer 5z has been formed to cover the gate connecting layer 3b, the gate connecting layer 3b can be prevented from getting corroded.

The terminal portion 20A further includes an insulating layer 4 which has been formed over the gate connecting layer 3b. A hole 4u is formed in the insulating layer 4. Inside the hole 4u, the conductor region 5b is electrically connected to the gate connecting layer 3b. Furthermore, since the source connecting layer 6b is electrically connected to the conductor region 5b, the source connecting layer 6b is electrically connected to the gate connecting layer 3b via the conductor region 5b. The conductor region 5b may also contain an impurity (such as B (boron)) at a higher concentration than the oxide semiconductor layer 5. The source connecting layer 6b is covered with the protective layer 8.

Next, respective components of the TFT substrate 100A will be described in detail one by one.

The substrate 1 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 1 may also be a silicon substrate.

The transparent electrode 2 and transparent connecting layer 2a are formed out of a transparent conductive film such as an ITO (indium tin oxide) film or an IZO film. The thickness of the transparent electrode 2 and transparent connecting layer 2a suitably falls within the range of about 20 nm to about 200 nm, for example. The transparent electrode 2 and transparent connecting layer 2a may each have a thickness of about 100 nm, for example.

The gate electrode 3 is electrically connected to a gate line 3'. The gate electrode 3, gate connecting layers 3a and 3b and gate line 3' may have a multilayer structure, of which the upper layer is a W (tungsten) layer and the lower layer is a TaN (tantalum nitride) layer, for example. Alternatively, the gate electrode 3, gate connecting layers 3a and 3b and gate line 3' may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3, gate connecting layers 3a and 3b and gate line 3' may be made of an element selected from the group consisting of Cu (copper), Al, Cr (chromium), Ta (tantalum), Ti (titanium), Mo and W or an alloy or metal nitride which is comprised mostly of any of these elements. The thickness of the gate electrode 3, gate connecting layers 3a and 3b and gate line 3' suitably falls within the range of about 50 nm to about 600 nm, for example. The gate electrode 3, gate connecting layers 3a and 3b and gate line 3' may each have a thickness of approximately 420 nm, for example.

The insulating layer (gate insulating layer) 4 is comprised of insulating layers 4b and 4c. The insulating layer 4c suitably includes an oxide insulating layer, which is suitably in direct contact with the oxide semiconductor layer 5. If the oxide insulating layer is in direct contact with the oxide semiconductor layer 5, oxygen included in the oxide insulating layer is supplied to the oxide semiconductor layer 5, and it is possible to prevent the oxygen deficiencies in the oxide semiconductor layer 5 from deteriorating the semiconductor properties. The insulating layer 4c may be an $SiO_2$ (silicon dioxide) layer, for example, while the insulating layers 4a and 4b may be $SiN_x$ (silicon nitride) layers, for example. In this embodiment, the insulating layer 4a may have a thickness of approximately 100 nm, the insulating layer 4b may have a thickness of approximately 325 nm, the insulating layer 4c may have a thickness of approximately 50 nm, and the gate insulating layer 4 may have an overall thickness of approximately 375 nm. The insulating layer 4a and gate insulating layer 4 may be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 4 suitably falls within the range of about 50 nm to about 600 nm. To prevent dopants from diffusing from the substrate 1, the insulating layers 4a and 4b are suitably made of $SiN_x$ or $SiN_xO_y$ (silicon nitride oxide, where x>y). Meanwhile, to prevent the semiconductor properties of the oxide semiconductor layer 5 from deteriorating, the insulating layer 4c is suitably made of $SiO_2$ or $SiO_xN_y$ (silicon oxynitride, where x>y). Furthermore, to form a dense gate insulating layer 4 which causes little gate leakage current at low temperatures, the gate insulating layer 4 is suitably formed using a rare gas of Ar (argon), for example.

The oxide semiconductor layer 5 and oxide layer 5z may be In—Ga—Zn—O based oxide layers including In (indium), Ga (gallium) and Zn (zinc) at the ratio of 1:1:1, for example (which will be hereinafter referred to as "In—Ga—Zn—O based oxide layers"). The ratio of In, Ga and Zn may be selected appropriately. In this description, an In—Ga—Zn—O based oxide which exhibits a semiconductor property will be hereinafter referred to as an "In—Ga—Zn—O based semiconductor".

The oxide semiconductor layer 5 may be an In—Ga—Zn—O based semiconductor layer. However, the oxide semiconductor layer 5 does not have to be formed out of an In—Ga—Zn—O based semiconductor film, but may also be formed out of any other suitable oxide semiconductor film such as a Zn—O based semiconductor (ZnO) film, an In—Zn—O based semiconductor (IZO™) film, a Zn—Ti—O based semiconductor (ZTO) film, a Cd—Ge—O based semiconductor film, a Cd—Pb—O based semiconductor film, a CdO (cadmium oxide) film, or an Mg—Zn—O based semiconductor film. Furthermore, the oxide semiconductor layer 5 may also be made of ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all. The thickness of the oxide semiconductor layer 5 and oxide layer 5z suitably falls within the range of about 30 nm to about 100 nm, for example. The oxide semiconductor layer 5 and the oxide layer 5z may each have a thickness of about 50 nm, for example.

The source electrode 6s is electrically connected to the source line 6. The source connecting layer 6a is made up of a number of islanded portions. The source electrode 6s, drain electrode 6d, source line 6 and source connecting layer 6a may have a multilayer structure consisting of Ti, Al and Ti layers, for example. Alternatively, the source electrode 6s, drain electrode 6d, source line 6 and source connecting layer 6a may also have a multilayer structure consisting of Mo, Al and Mo layers or may even have a single-layer structure, a double layer structure, or a multilayer structure consisting of four or more layers. Still alternatively, the source electrode 6s, drain electrode 6d, source line 6 and source connecting layer 6a may be made of an element selected from the group consisting of Al, Cr, Ta, Ti, Mo and W or an alloy or metal nitride which is comprised mostly of any of these elements. The thickness of the source electrode 6s, drain electrode 6d, source line 6 and source connecting layer 6a suitably falls within the range of about 50 nm to about 600 nm, for example. In this embodiment, the source electrode 6s, drain electrode 6d, source line 6 and source connecting layer 6a may have a thickness of approximately 350 nm, for example.

The protective layer 8 has been formed so as to contact with the channel region of the oxide semiconductor layer 5. The protective layer 8 is suitably made of an oxide (such as $SiO_2$). If the protective layer 8 is made of an oxide, it is possible to prevent the oxygen deficiencies in the oxide semiconductor layer 5 from deteriorating the semiconductor properties as described above. Alternatively, the protective layer 8 may also be made of SiON (which may be either silicon oxynitride or silicon nitride oxide), $Al_2O_2$ or $Ta_2O_5$, for example. The thickness of the protective layer 8 suitably falls within the range of about 50 nm to about 300 nm, for example. In this embodiment, the protective layer 8 may have a thickness of about 150 nm, for example.

The transparent electrode 7 may be formed out of an In—Ga—Zn—O layer, for example. As will be described in detail later, the transparent electrode 7, oxide semiconductor layer 5 and oxide layer 5z are formed out of the same transparent oxide film (such as an In—Ga—Zn—O film). If the transparent electrode 7, oxide semiconductor layer 5 and oxide layer 5z are formed out of the same oxide film, the manufacturing process can be simplified and the manufacturing cost can be cut down. The transparent electrode 7 suitably has a thickness of about 20 nm to about 200 nm. In this embodiment, the transparent electrode 7 may have a thickness of about 50 nm, for example.

As will be described in detail later, the transparent electrode 7 may contain either a p-type impurity (such as B (boron)) or an n-type impurity (such as P (phosphorus)) at a higher concentration than the oxide semiconductor layer 5.

This TFT substrate 100A may be used in a fringe field switching (FFS) mode liquid crystal display device, for example.

In this TFT substrate 100A, the transparent electrode (common electrode) 2 is arranged closer to the substrate 1 than the transparent electrode (pixel electrode) 7 is. That is why this TFT substrate 100A can be used in not only the FFS mode liquid crystal display device but also liquid crystal display devices in various other liquid crystal modes (including the TN (twisted nematic) mode and VA (vertical alignment) mode) as well.

Next, an exemplary method for fabricating the TFT substrate 100A will be described.

A method for fabricating a semiconductor device (TFT substrate) 100A according to an embodiment of the present invention includes the steps of: (a) providing a substrate 1; (b) forming, on the substrate 1, a gate electrode 3 and a gate connecting layer 3a out of the same conductive film and a transparent electrode 2 and a transparent connecting layer 2a out of the same transparent conductive film; and (c) forming an insulating layer 4 over the gate electrode 3 and the transparent electrode 2. The method for fabricating the TFT substrate 100A further includes the steps of: (d) forming an oxide semiconductor film over the insulating layer 4; and (e) forming a conductive film on the oxide semiconductor film, thereby splitting the oxide semiconductor film into first and second oxide semiconductor films 5i, 5ii and forming a source electrode 6s, a drain electrode 6d and a source connecting layer 6a out of the conductive film. The method for fabricating the TFT substrate 100A further includes the step (f) of performing a resistance lowering process L to lower the resistance of the second oxide semiconductor film 5ii locally, thereby forming an oxide layer 5z including a conductor region 5a and turning the rest of the first oxide semiconductor film 5i, of which the resistance has not been lowered through the resistance lowering process L, into an oxide semiconductor layer 5. In this process step (f), the source connecting layer 6a is electrically connected to either the gate connecting layer 3a or the transparent connecting layer 2a via the conductor region 5a.

The step (f) suitably includes the step (f1) of forming a transparent electrode 7 by performing the resistance lowering process L on the oxide semiconductor film 5i locally so that the transparent electrode 7 overlaps at least partially with the transparent electrode 2 with the insulating layer 4 interposed between them.

The step (f) includes the step of implanting an impurity into the first and second oxide semiconductor films 5i and 5ii.

This is a simplified method for fabricating a semiconductor device and will contribute to cutting the manufacturing cost.

Next, an exemplary method for fabricating the TFT substrate 100A will be described in detail with reference to FIGS. 6 to 8, which are schematic cross-sectional views illustrating respective manufacturing process steps to fabricate the TFT substrate 100A according to an embodiment of the present invention. Portions (a1), (b1) and (c1) of FIGS. 6 to 8 correspond to FIG. 1(b) and portions (a2), (b2), (c2), (a3), (b3) and (c3) of FIGS. 6 to 8 correspond to FIG. 2(b).

Figure 6:
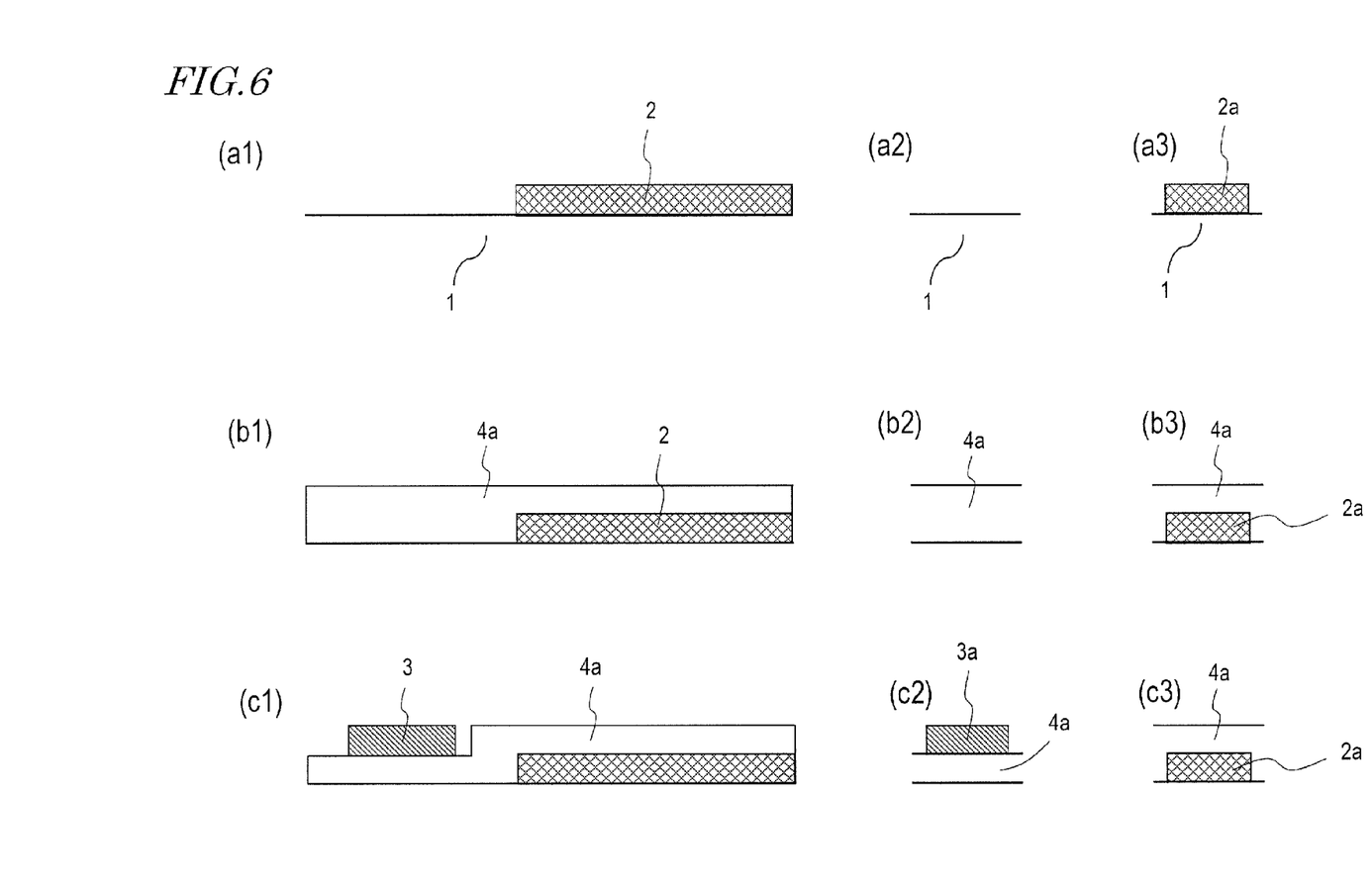
FIG. 6 (a1) to (c1), (a2) to (c2), and (a3) to (c3) are schematic cross-sectional views illustrating respective manufacturing process steps to fabricate a TFT substrate 100A according to an embodiment of the present invention.

First of all, as shown in portions (a1) and (a3) of FIG. 6, a transparent electrode 2 and a transparent connecting layer 2a are formed on the substrate 1 out of the same transparent conductive film. The transparent electrode 2 and transparent connecting layer 2a are formed separately from each other and not electrically connected together. As the substrate 1, a transparent insulating substrate such as a glass substrate may be used, for example. The transparent electrode 2 and transparent connecting layer 2a may be formed by a known method such as a sputtering process. The transparent electrode 2 and transparent connecting layer 2a may be made of ITO, for example, and may have a thickness of about 100 nm, for example. In the region shown in portion (a2) of FIG. 6, on the other hand, the substrate 1 is still exposed.

Next, as shown in portions (b1) to (b3) of FIG. 6, an insulating layer 4a is deposited over the transparent electrode 2, transparent connecting layer 2a and substrate 1 by CVD (chemical vapor deposition) process, for example. The insulating layer 4a may be made of $SiN_x$, for example, and may have a thickness of about 100 nm, for example.

Subsequently, as shown in portions (c1) and (c2) of FIG. 6, a gate electrode 3 and a gate connecting layer 3a are formed on the insulating layer 4a. The gate electrode 3 and gate connecting layer 3a may be formed by depositing a conductive film on the insulating layer 4a by sputtering process and then patterning the conductive film by photolithographic process. When viewed along a normal to the substrate 1, the gate electrode 3 does not overlap with the transparent electrode 2. The gate electrode 3 and gate connecting layer 3a are formed separately from each other. In this embodiment, used as the conductive film is a multilayer structure with a double-layer structure, in which a TaN film (with a thickness of about 50 nm) and a W film (with a thickness of about 370 nm) are stacked in this order on the substrate 1. Alternatively, a single-layer film, a multilayer film, an alloy film or a metal nitride film including an element selected from the group consisting of Ti, Mo, Ta, W, Cu, Al and Cr may also be used as the conductive film. In the region illustrated in portion (c3) of FIG. 6, on the other hand, neither the gate electrode 3 nor the gate connecting layer 3a is present.

Figure 7:
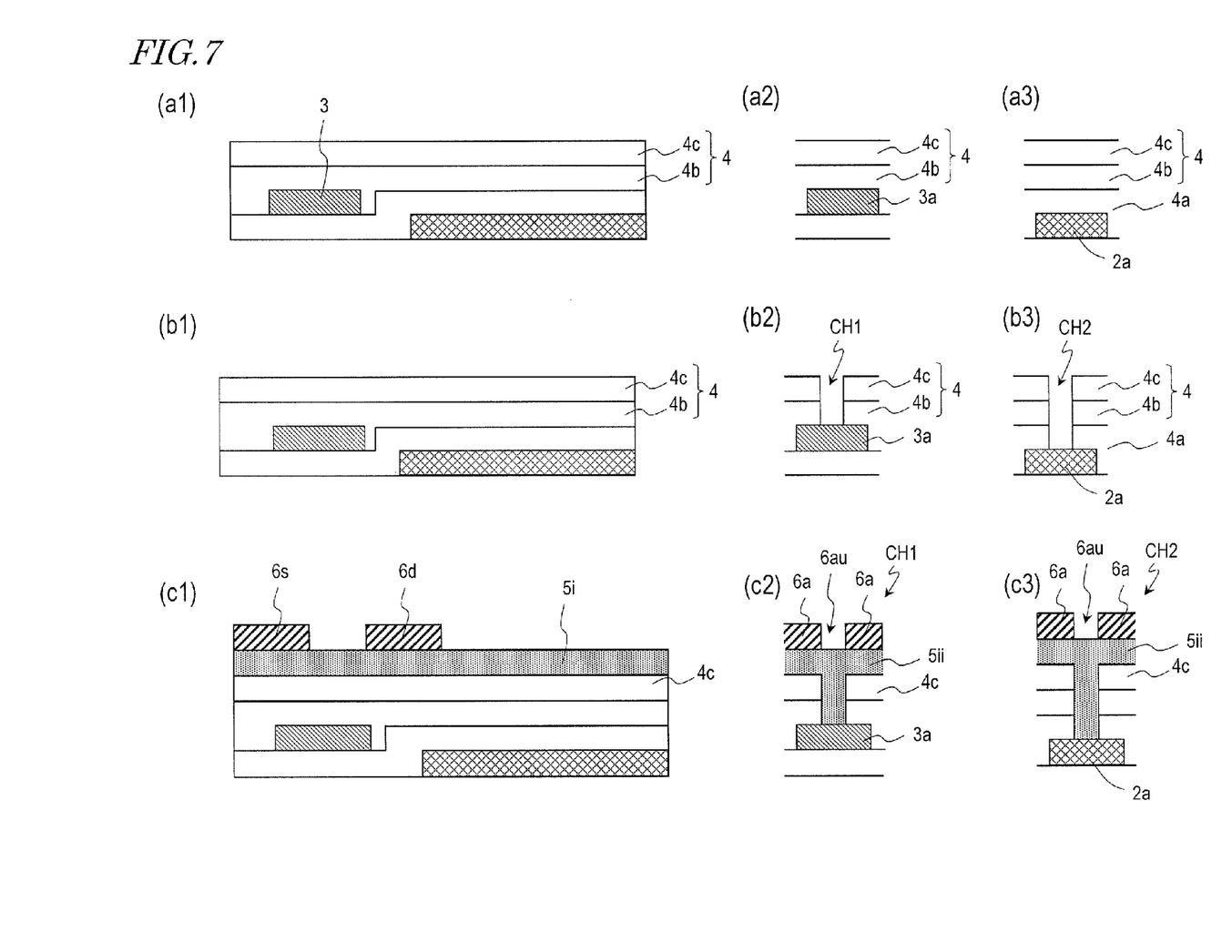
FIG. 7 (a1) to (c1), (a2) to (c2), and (a3) to (c3) are schematic cross-sectional views illustrating respective manufacturing process steps to fabricate a TFT substrate 100A according to an embodiment of the present invention.

Next, as shown in portions (a1) to (a3) of FIG. 7, insulating layers 4b and 4c are deposited by CVD process over the gate electrode 3 and gate connecting layer 3a. In this embodiment, the insulating layer 4b is formed out of an $SiN_x$ film (with a thickness of about 325 nm) and the insulating layer 4c is formed out of an $SiO_2$ film (with a thickness of about 50 nm).

These insulating layers 4b and 4c may be made of $SiO_2$, $SiN_x$, $SiO_xN_y$ (silicon oxynitride, where x>y), $SiN_xO_y$ (silicon nitride oxide, where x>y), $Al_2O_3$, or $Ta_2O_5$, for example.

Thereafter, as shown in portions (b2) and (b3) of FIG. 7, contact holes CH1 and CH2 are formed in the insulating layers 4b and 4c by a known method. The contact hole CH1 exposes the gate connecting layer 3a and the contact hole CH2 exposes the transparent connecting layer 2a.

Next, as shown in portions (c1) to (C3) of FIG. 7, an oxide semiconductor film is deposited on the insulating layer 4c by sputtering process, for example. An In—Ga—Zn—O based semiconductor film may be used as the oxide semiconductor film. The oxide semiconductor film may have a thickness of about 50 nm, for example. Portions of the oxide semiconductor film are in contact with the gate connecting layer 3a and transparent connecting layer 2a inside the contact holes CH1 and CH2, respectively.

Subsequently, a conductive film (not shown) to be the source and drain electrodes 6s, 6d and source connecting layer 6a as will be described later is deposited on the oxide semiconductor film by sputtering process.

Thereafter, as shown in portions (c1) to (c3) of FIG. 7, the conductive film and the oxide semiconductor film are patterned simultaneously by photolithographic process using a half-tone mask, dry etching process and ashing process, thereby splitting the oxide semiconductor film into first and second oxide semiconductor films 5i and 5ii and forming source and drain electrodes 6s and 6d and a source connecting layer 6a out of the conductive film. Since the source electrode 6s and other conductor members can be formed and the oxide semiconductor film can be patterned into an intended shape in this manner using a single photomask, the manufacturing process can be simplified and the manufacturing cost can be cut down. A hole 6au which exposes the second oxide semiconductor film 5ii partially is formed in the source connecting layer 6a.

The source and drain electrodes 6s and 6d and source connecting layer 6a may have a multilayer structure consisting of Ti, Al and Ti layers, for example. The lower Ti layer may have a thickness of about 50 nm, the Al layer may have a thickness of about 200 nm, and the upper Ti layer may have a thickness of about 100 nm.

Subsequently, as shown in portion (a1) of FIG. 8, a protective layer 8 is formed by CVD and photolithographic processes so as to cover the channel region of the first oxide semiconductor film 5i. The protective layer 8 may be made of an oxide (such as $SiO_2$), for example, and may have a thickness of about 150 nm. Also, when viewed along a normal to the substrate 1, an end portion of the protective layer 8 suitably overlaps with the drain electrode 6d. In that case, the resistance lowering process L to be described later may be performed on even a portion of the first oxide semiconductor film 5i which is located at an end portion of the drain electrode 6d.

Figure 8:
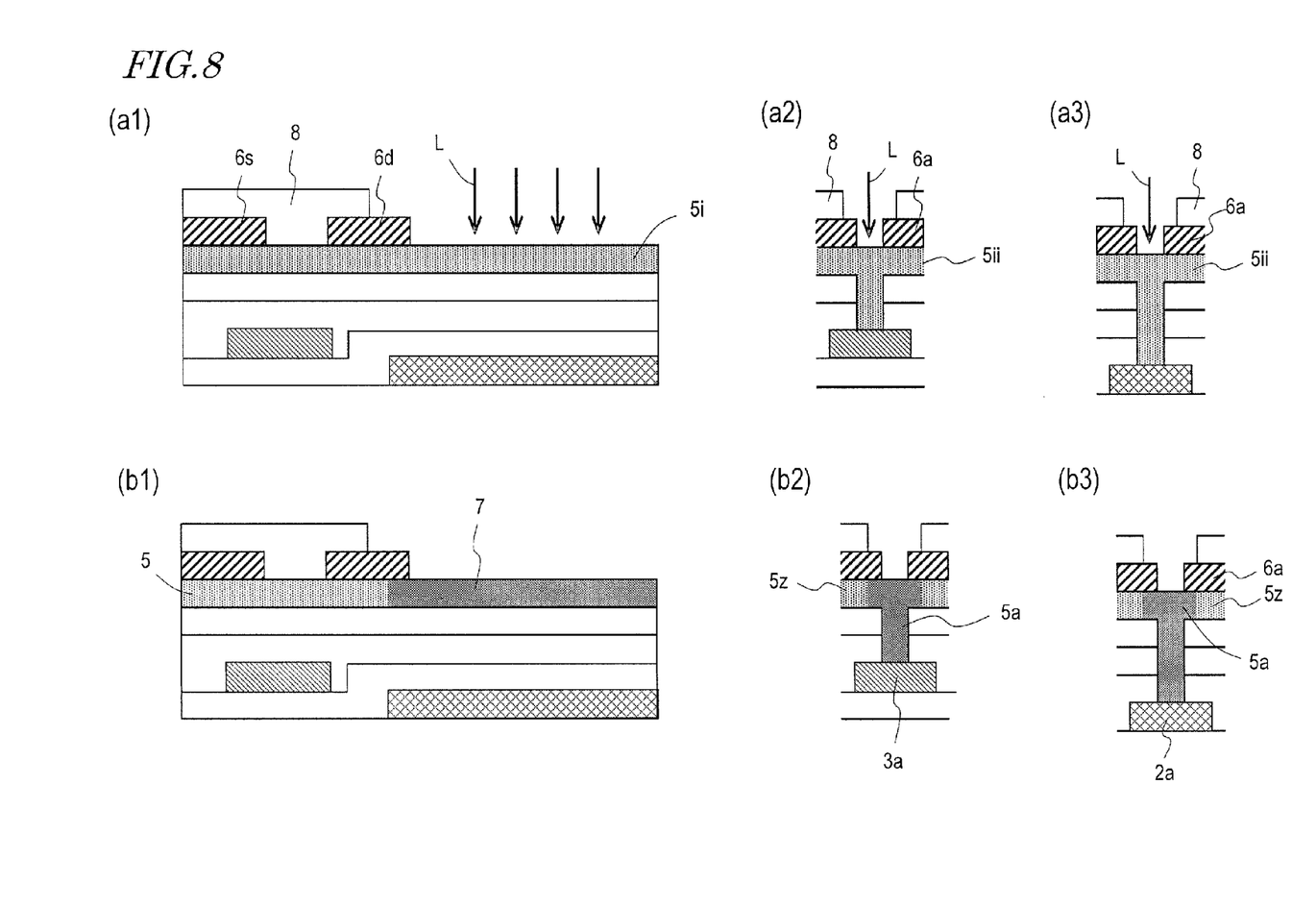
FIG. 8 (a1), (b1), (a2), (b2), (a3) and (b3) are schematic cross-sectional views illustrating respective manufacturing process steps to fabricate a TFT substrate 100A according to an embodiment of the present invention.

In addition, the protective layer 8 is suitably formed on the source connecting layer 6a, too, so that an end portion of the protective layer 8 is located on the source connecting layer 6a as shown in portions (a2) and (a3) of FIG. 8.

Next, as shown in portions (a1) to (a3) of FIG. 8, portions of the first and second oxide semiconductor films 5i and 5ii are subjected to a resistance lowering process L. Meanwhile, the rest of the first and second oxide semiconductor films 5i and 5ii which is covered with the source and drain electrodes 6s, 6d, source connecting layer 6a and protective layer 8 is not subjected to the resistance lowering process L.

As a result of this resistance lowering process L, as shown in portion (b1) of FIG. 8, that portion of the first oxide semiconductor film 5i that has been subjected to the resistance lowering process L turns into a transparent electrode 7, while the other portion that has not been subjected to the resistance lowering process L turns into an oxide semiconductor layer 5. On the other hand, as shown in portions (b2) and (b3) of FIG. 8, that portion of the oxide layer 5z formed out of the second oxide semiconductor film 5ii that has been subjected to the resistance lowering process L turns into a conductor region 5a, while the other portion that has not been subjected to the resistance lowering process L remains a semiconductor region. By forming the conductor region 5a, the source connecting layer 6a gets electrically connected to either the transparent connecting layer 2a or gate connecting layer 3a via the conductor region 5a. Naturally, the electrical resistance of that portion subjected to the resistance lowering process L is lower than that of the other portion not subjected to the resistance lowering process L. The resistance lowering process L may be plasma processing or doping a p-type impurity (such as B (boron)) or an n-type impurity (such as P (phosphorus)), for example. If an impurity doping process is adopted as the resistance lowering process L, then the impurity concentration of the transparent electrode 7 (or the conductor region 5a) becomes higher than that of the oxide semiconductor layer 5. Also, due to diffusion of the impurity, a portion of the first oxide semiconductor film 5i which is located under the drain electrode 6d may sometimes have its resistance lowered and form part of the transparent electrode 7. Examples of alternative resistance lowering processes L include hydrogen plasma processing using a CVD system, argon plasma processing using an etching system, and an annealing process under a reducing ambient.

Next, a TFT substrate 100B according to another embodiment of the present invention will be described with reference to FIG. 9, which is a schematic cross-sectional view illustrating the TFT substrate 100B and corresponds to the cross-sectional view of the TFT substrate 100A shown in FIG. 1(b). In FIG. 1(b), any component also included in the TFT substrate 100A and having substantially the same function as its counterpart is identified by the same reference numeral as its counterpart's and description thereof will be omitted herein to avoid redundancies. This TFT substrate 100B also includes a connecting portion to connect the source connecting layer 6a to either the transparent connecting layer 2a or gate connecting layer 3a as shown in FIGS. 2(a) and 2(b). However, since the connecting portion is the same as the counterpart of the TFT substrate 100A, its description and illustration will be omitted herein.

Figure 9:
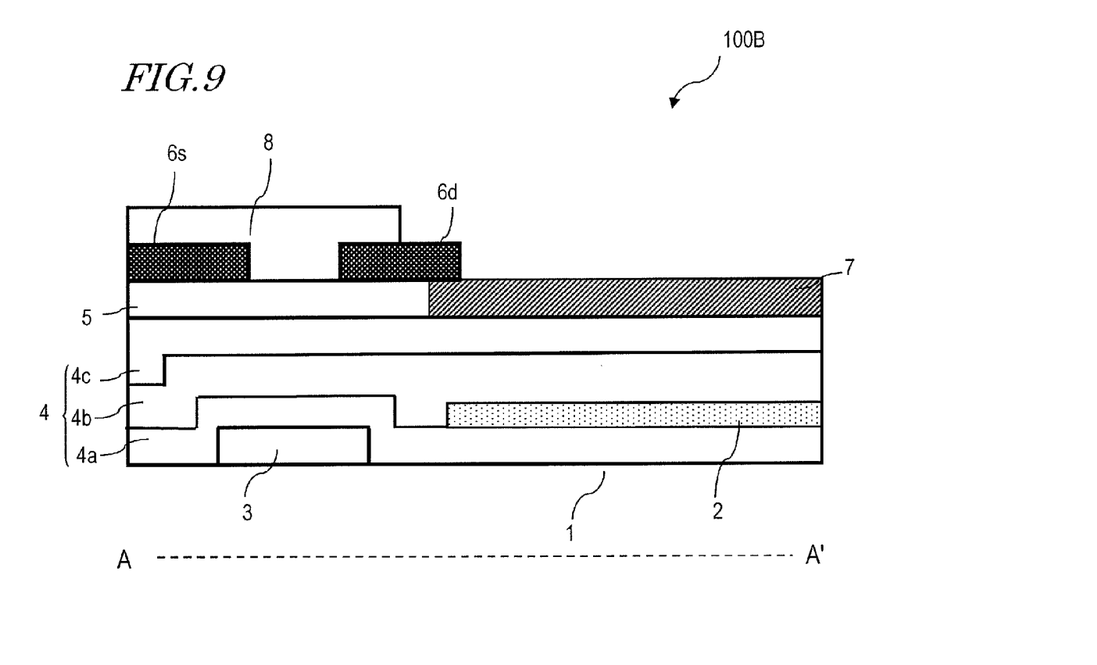
FIG. 9 A schematic cross-sectional view illustrating a TFT substrate 100B according to another embodiment of the present invention.

In the TFT substrate 100B shown in FIG. 9, the gate electrode 3 is arranged closer to the substrate 1 than the transparent electrode 2 is. Specifically, the TFT substrate 100B includes a gate electrode 3 formed on the substrate 1, an insulating layer 4a formed over the gate electrode 3, and a transparent electrode 2 formed on the insulating layer 4a. In this TFT substrate 100B, the insulating layers 4a to 4c together function as a gate insulating layer 4.

A method for fabricating this TFT substrate 100B will now be described with reference to FIG. 10. FIGS. 10(a) to 10(c) are schematic cross-sectional views illustrating respective manufacturing process steps to fabricate the TFT substrate 100B.

Figure 10:
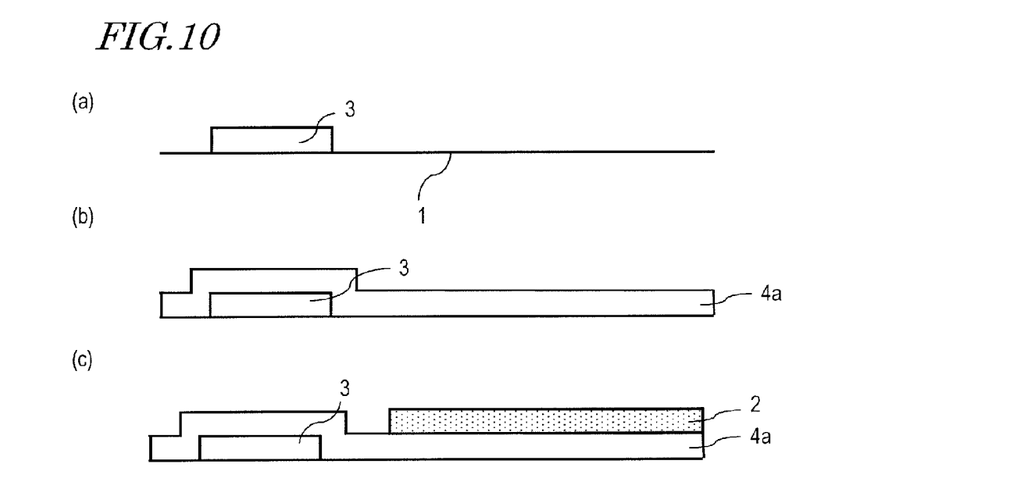
FIG. 10 (a) to (c) are schematic cross-sectional views illustrating respective manufacturing process steps to fabricate the TFT substrate 100B.

First of all, as shown in FIG. 10(a), a gate electrode 3 is formed on the substrate 1 by the method described above. In the meantime, a gate connecting layer 3a is also formed on the substrate 1 at the same time.

Next, as shown in FIG. 10(b), an insulating layer 4a is formed over the gate electrode 3 by the method described above.

Subsequently, as shown in FIG. 10(c), a transparent electrode 2 is formed by the method described above. It should be noted that when viewed along a normal to the substrate 1, the gate electrode 3 does not overlap with the transparent electrode 2.

Thereafter, insulating layers 4b, 4c, an oxide semiconductor layer 5, a conductor region 5a, source and drain electrodes 6s, 6d, a source connecting layer 6a, a transparent electrode 7 and a protective layer 8 are formed by the methods described above (see FIGS. 7 and 8). In this manner, the TFT substrate 100B shown in FIG. 9 is completed.

As can be seen from the foregoing description, embodiments of the present invention provide a TFT substrate which can be fabricated by a simplified process and which contributes to realizing a display device with higher definition and a higher aperture ratio than conventional ones and also provide a method for fabricating such a substrate.

INDUSTRIAL APPLICABILITY

Embodiments of the present invention are applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 1 substrate
2 transparent electrode
3 gate electrode
3a gate connecting layer
3' gate line
4, 4a, 4b, 4c insulating layer
5 oxide semiconductor layer
5b conductor region
6 source line
6a, 6b source connecting layer
6d drain electrode
6s source electrode
7 transparent electrode
8 protective layer
10A thin-film transistor
20A terminal portion
100A TFT substrate

The invention claimed is:

1. A semiconductor device comprising a substrate, and a thin-film transistor and a first transparent electrode which are formed on the substrate,
wherein the thin-film transistor includes:
a gate electrode formed on the substrate;
a first insulating layer formed over the gate electrode;
an oxide semiconductor layer formed on the first insulating layer; and
source and drain electrodes electrically connected to the oxide semiconductor layer,
the semiconductor device further includes:
a gate connecting layer formed on the substrate out of a same conductive film as the gate electrode, or a transparent connecting layer formed on the substrate out of a same conductive film as the first transparent electrode;
an oxide layer which is formed on the first insulating layer and which includes at least one conductor region and at least one semiconductor region; and
a source connecting layer formed on the oxide layer out of a same conductive film as the source electrode, and
the source connecting layer is in direct contact with the at least one conductor region and the at least one semiconductor region and is electrically connected to either the gate connecting layer or the transparent connecting layer via the at least one conductor region.

2. The semiconductor device of claim 1, wherein the conductor region contains an impurity at a higher concentration than the oxide semiconductor layer.

3. The semiconductor device of claim 1, further comprising a second transparent electrode arranged so as to overlap partially with the first transparent electrode with the first insulating layer interposed between them,
wherein the oxide semiconductor layer, the oxide layer and the second transparent electrode are formed out of a same oxide film.

4. The semiconductor device of claim 3, wherein the oxide film includes In, Ga and Zn.

5. The semiconductor device of claim 3, wherein the drain electrode is formed on the second transparent electrode, and
the second transparent electrode is in direct contact with the drain electrode.

6. The semiconductor device of claim 1, further comprising a second insulating layer formed between the gate electrode and the substrate,
wherein the second insulating layer is formed on the first transparent electrode.

7. The semiconductor device of claim 1, further comprising a second insulating layer formed on the gate electrode,
wherein the first transparent electrode is formed on the second insulating layer.

8. The semiconductor device of claim 1, wherein the oxide semiconductor layer and the oxide layer are made of a same oxide film.

9. A method for fabricating a semiconductor device, the method comprising the steps of:
(a) providing a substrate;
(b) forming, on the substrate, a gate electrode and a gate connecting layer out of a same first conductive film, and a first transparent electrode and a transparent connecting layer out of a same transparent conductive film;
(c) forming a first insulating layer over the gate electrode and the first transparent electrode;
(d) forming an oxide semiconductor film over the first insulating layer;
(e) forming a second conductive film on the oxide semiconductor film, then forming first and second oxide semiconductor films separated from each other out of the oxide semiconductor film and forming a source electrode, a drain electrode and a source connecting layer out of the second conductive film; and
(f) forming an oxide layer including a conductor region and a semiconductor region by performing a resistance lowering process to lower a resistance of a part of the second oxide semiconductor film, an oxide semiconductor layer being formed in a rest of the first oxide semiconductor film, of which a resistance has not been lowered through the resistance lowering process, wherein the source connecting layer is in direct contact with the conductor region and the semiconductor region and is electrically connected to either the gate connecting layer or the transparent connecting layer via the conductor region.

10. The method of claim 9, wherein the step (f) includes the step (f1) of forming a second transparent electrode by performing the resistance lowering process on a portion of the first oxide semiconductor film, the second transparent electrode overlapping at least partially with the first transparent electrode with the first insulating layer interposed between them.

11. The method of claim 9, wherein the step (f) includes the step of implanting an impurity into the first and second oxide semiconductor films.

12. The method of claim 9, wherein the step (b) includes the steps of: forming the first transparent electrode on the substrate and a second insulating layer on the first transparent electrode, respectively; and forming the gate electrode on the second insulating layer.

13. The method of claim 9, wherein the step (b) includes the steps of: forming the gate electrode on the substrate and a second insulating layer on the gate electrode, respectively; and forming the first transparent electrode on the second insulating layer.

14. The method of claim 9, wherein the oxide semiconductor film includes In, Ga and Zn.

\* \* \* \* \*